(12) United States Patent
Sugaya

(10) Patent No.: US 10,879,268 B2
(45) Date of Patent: Dec. 29, 2020

(54) STORAGE DEVICE

(71) Applicant: SONY SEMICONDUCTOR SOLUTIONS CORPORATION, Kanagawa (JP)

(72) Inventor: Fumitaka Sugaya, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/485,894

(22) PCT Filed: Feb. 2, 2018

(86) PCT No.: PCT/JP2018/003568
§ 371 (c)(1),
(2) Date: Aug. 14, 2019

(87) PCT Pub. No.: WO2018/155133
PCT Pub. Date: Aug. 30, 2018

(65) Prior Publication Data
US 2020/0058659 A1 Feb. 20, 2020

(30) Foreign Application Priority Data
Feb. 23, 2017 (JP) ................. 2017-032548

(51) Int. Cl.
*G11C 11/22* (2006.01)
*H01L 27/1159* (2017.01)

(52) U.S. Cl.
CPC ........ *H01L 27/1159* (2013.01); *G11C 11/223* (2013.01); *G11C 11/2273* (2013.01); *G11C 11/2275* (2013.01)

(58) Field of Classification Search
CPC ... G11C 11/22; G11C 11/223; G11C 11/2275; G11C 11/221; G11C 13/0004;
(Continued)

(56) References Cited

U.S. PATENT DOCUMENTS

| 5,412,596 A | 5/1995 | Hoshiba |
| 2010/0073988 A1 | 3/2010 | Takahashi et al. |

(Continued)

FOREIGN PATENT DOCUMENTS

| JP | 05-120866 A | 5/1993 |
| JP | 09-135009 A | 5/1997 |

(Continued)

OTHER PUBLICATIONS

International Search Report and Written Opinion of PCT Application No. PCT /JP2018/003568, dated May 1, 2018, 07 pages of ISRWO.

*Primary Examiner* — Thong Q Le
(74) *Attorney, Agent, or Firm* — Chip Law Group

(57) ABSTRACT

A storage device according to the disclosure includes a first transistor and a second transistor each including a first diffusion layer, a second diffusion layer, and a gate, and that are each able to store a threshold state, a first signal line, a second signal line, a first switch transistor that is turned on and couples the first signal line and the first diffusion layer of the first transistor, a second switch transistor that is turned on and couples the second diffusion layer of the first transistor and the first diffusion layer of the second transistor, and a third switch transistor that is turned on and couples the second diffusion layer of the second transistor and the second signal line.

13 Claims, 10 Drawing Sheets

(58) Field of Classification Search
CPC .............. G11C 13/0028; G11C 13/004; G11C 11/2273; G11C 13/0026; G11C 16/04; G11C 16/26; G11C 16/3427; G11C 11/2259; G11C 11/2293; G11C 11/417; G11C 14/0072; G11C 5/147; G11C 5/148; H01L 27/1159; H01L 27/1104; H01L 29/78391; H03K 3/012; H03K 3/356; H03K 3/356008
USPC .......... 365/145, 149, 65, 117, 163, 199, 200, 365/49.13
See application file for complete search history.

(56) References Cited

U.S. PATENT DOCUMENTS

2011/0305062 A1* 12/2011 Byun ...................... G11C 11/22
365/145
2014/0254274 A1 9/2014 Shuto et al.

FOREIGN PATENT DOCUMENTS

JP  2010-079941 A  4/2010
JP  2014-175020 A  9/2014

\* cited by examiner

[FIG. 1]
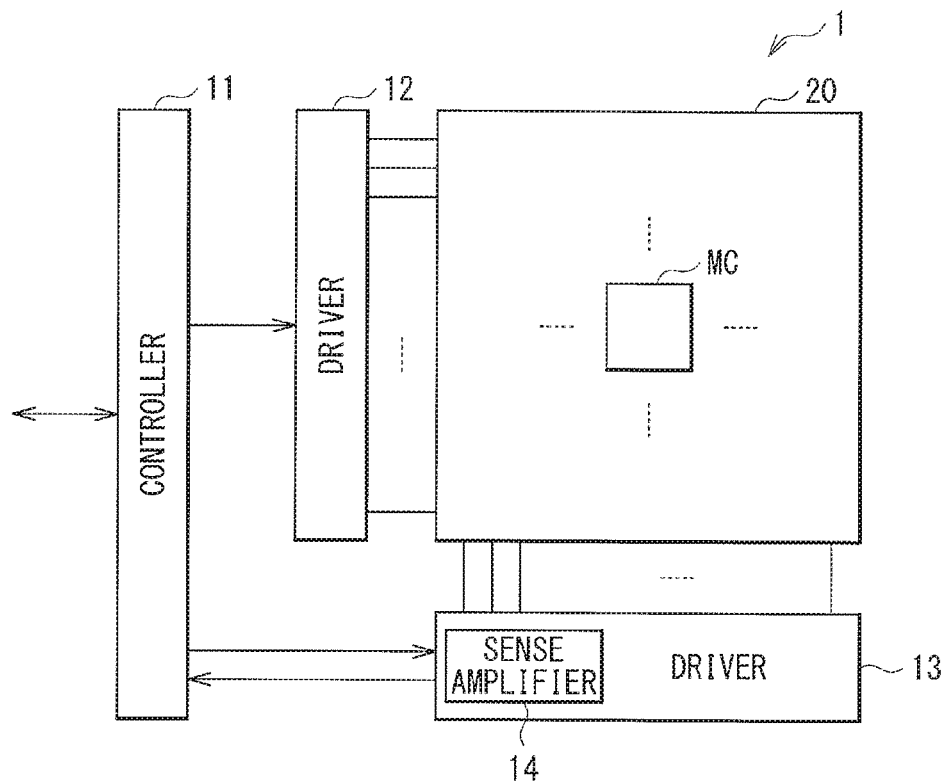
[FIG. 2]
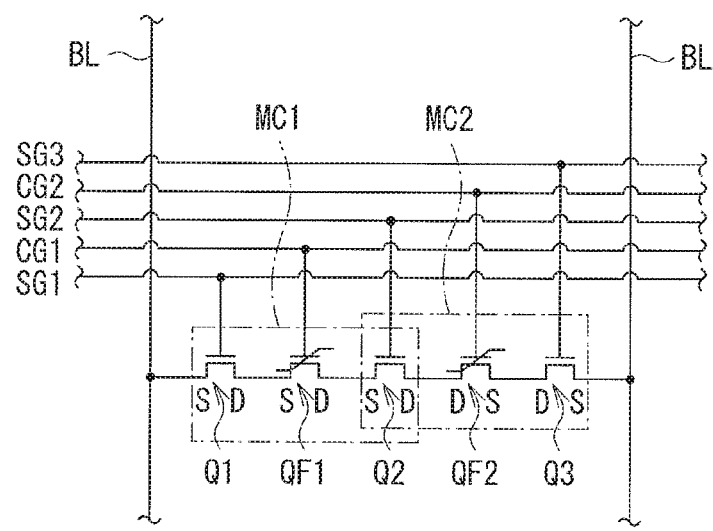

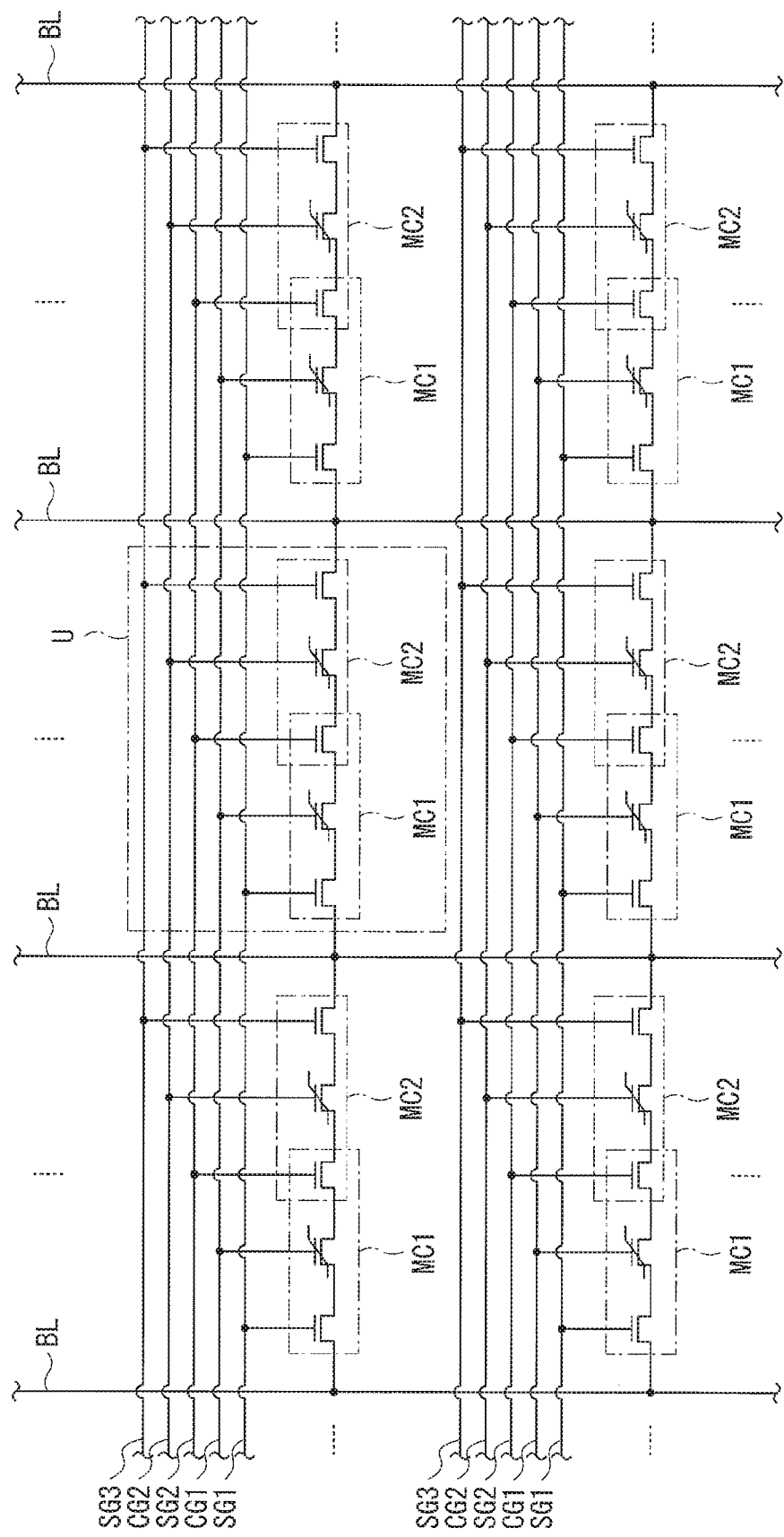
[FIG. 3]

[FIG. 4]
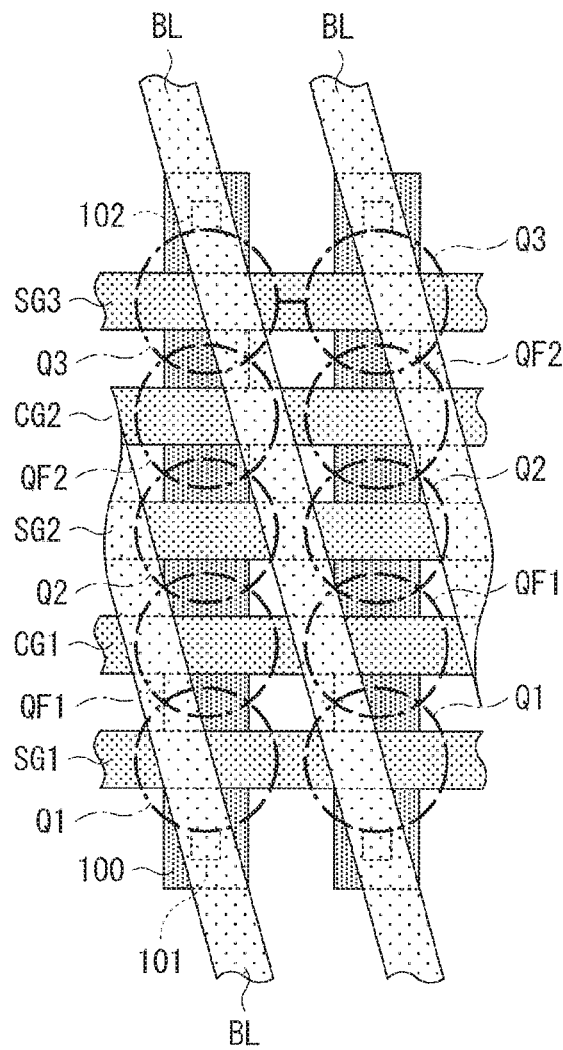
[FIG. 5]
|  | VSG1 | VCG1 | VSG2 | VCG2 | VSG3 | VBL1 | VBL2 |
|---|---|---|---|---|---|---|---|
| PROGRAMMING OPERATION | 3V | 3V | 0V | 0V | 0V | 0V | 3V |
| ERASING OPERATION | 3V | 0V | 0V | 0V | 0V | 3V | 0V |
| READING OPERATION | 1V | 0.5V | 1V | 1V | 1V | 0V | 1V |

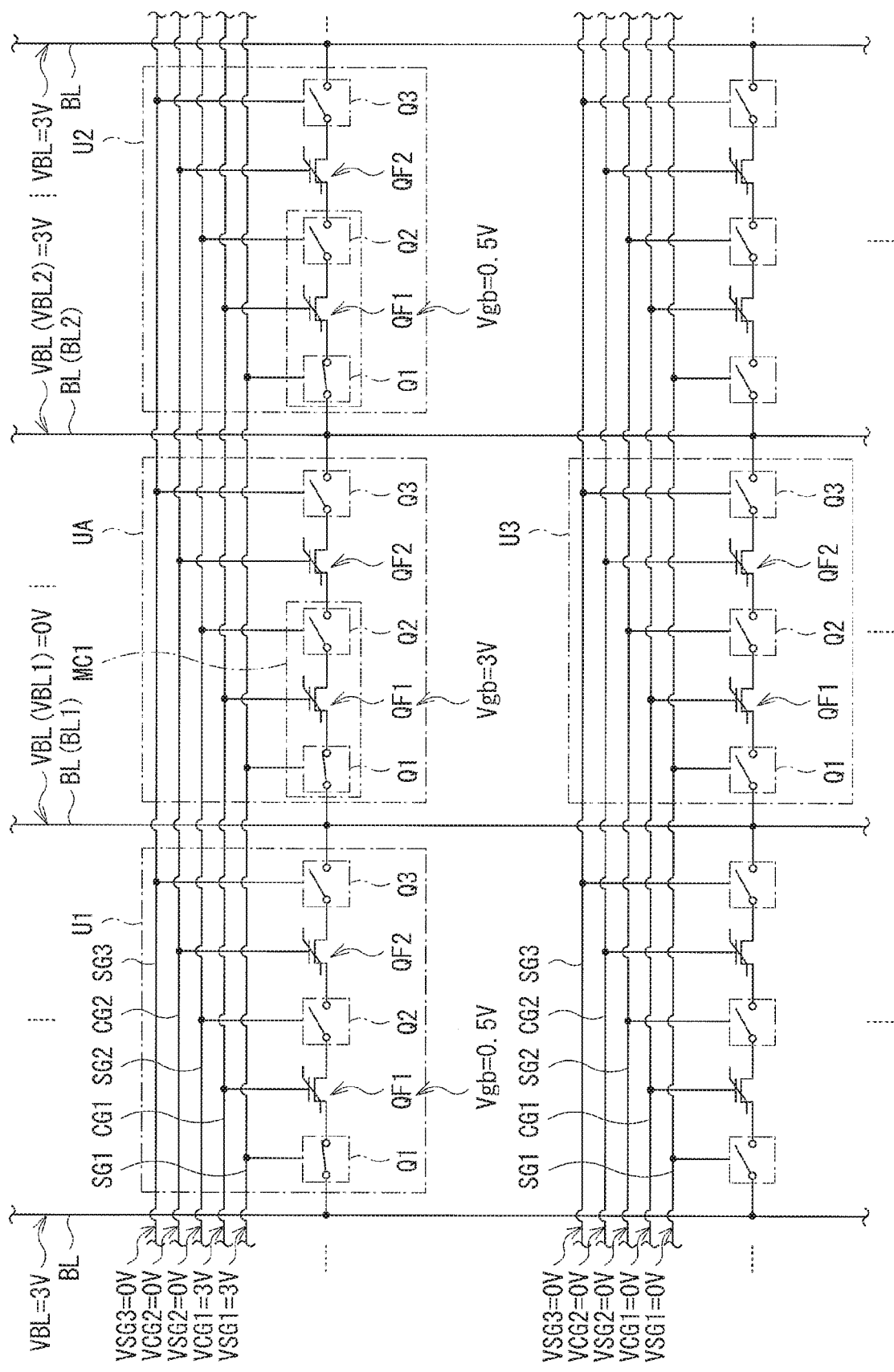
[FIG. 6]

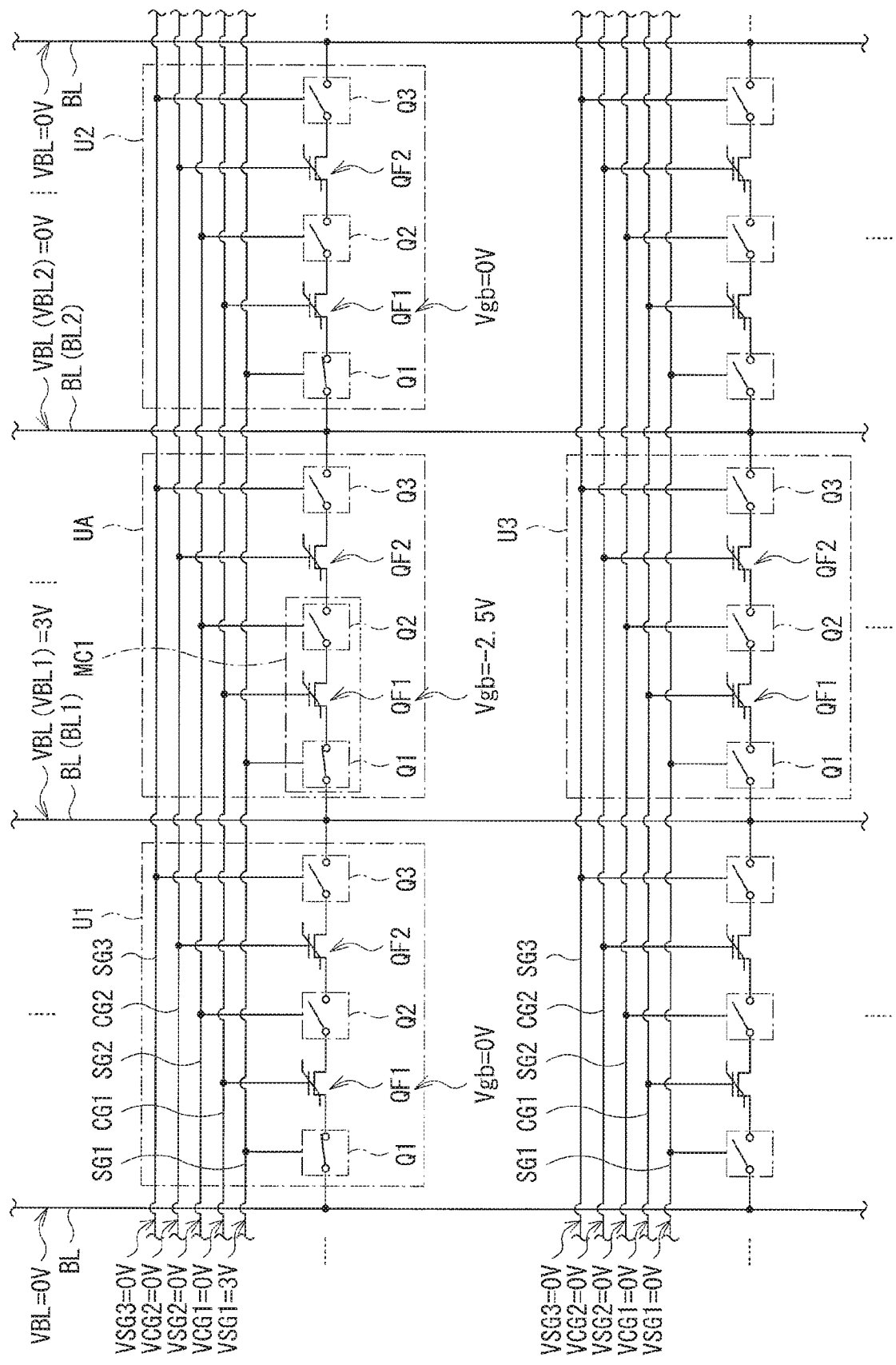
[FIG. 7]

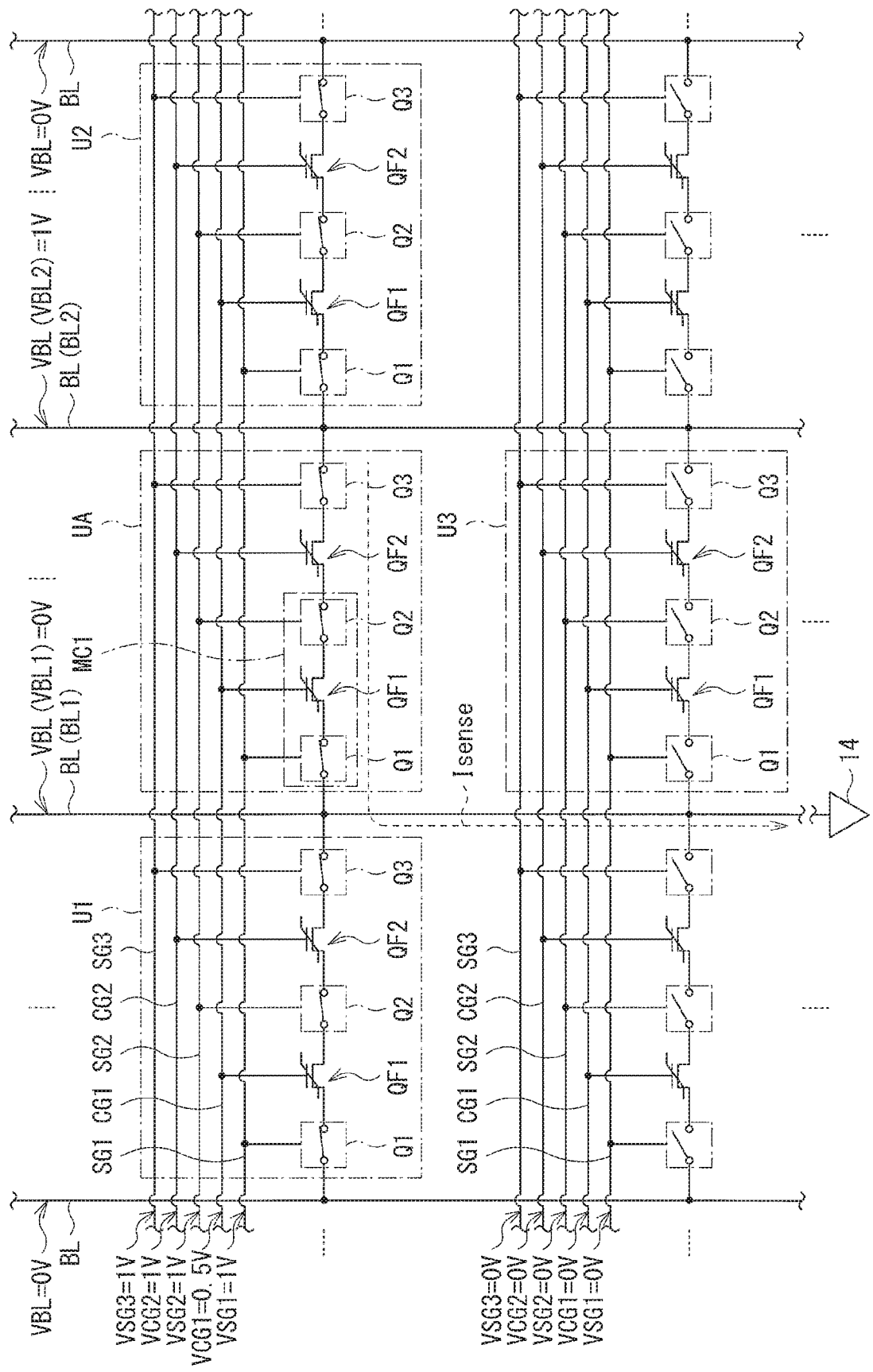
[FIG. 8]

[ FIG. 9 ]

|  | VSG1 | VCG1 | VSG2 | VCG2 | VSG3 | VBL1 | VBL2 |
|---|---|---|---|---|---|---|---|
| PROGRAMMING OPERATION | 0V | 0V | 0V | 3V | 3V | 3V | 0V |
| ERASING OPERATION | 0V | 0V | 0V | 0V | 3V | 0V | 3V |
| READING OPERATION | 1V | 1V | 1V | 0.5V | 1V | 1V | 0V |

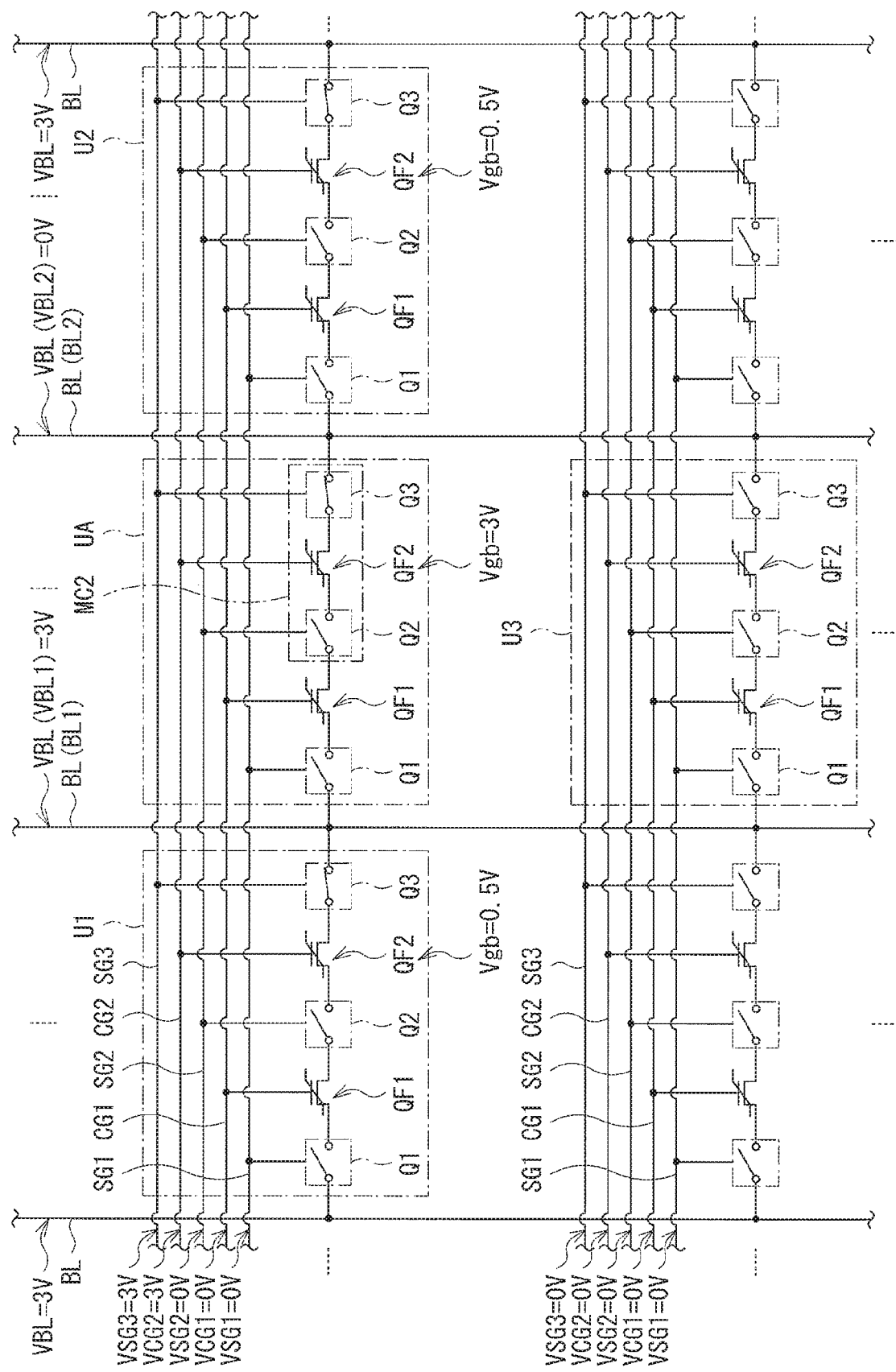

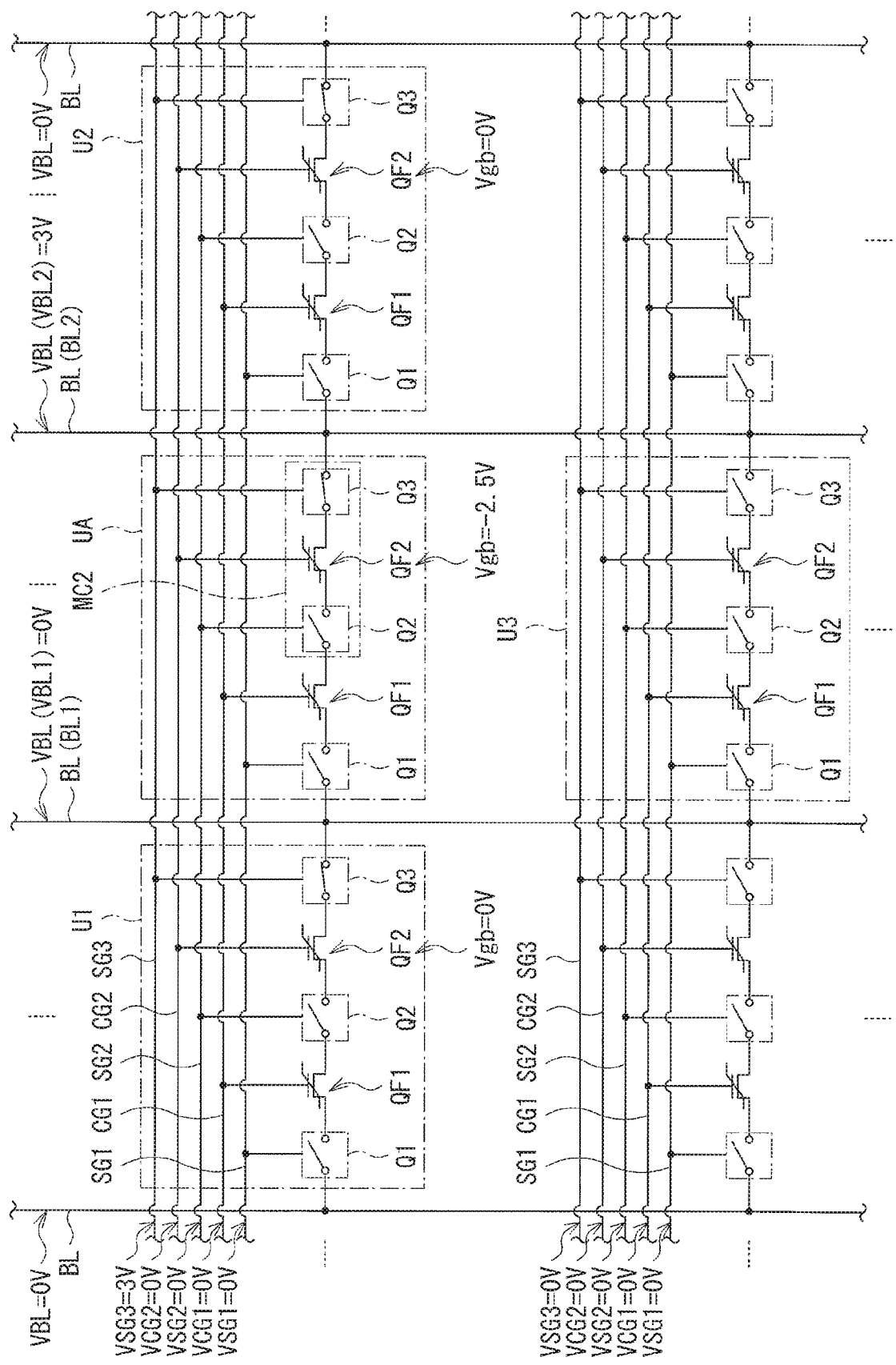
[FIG. 11]

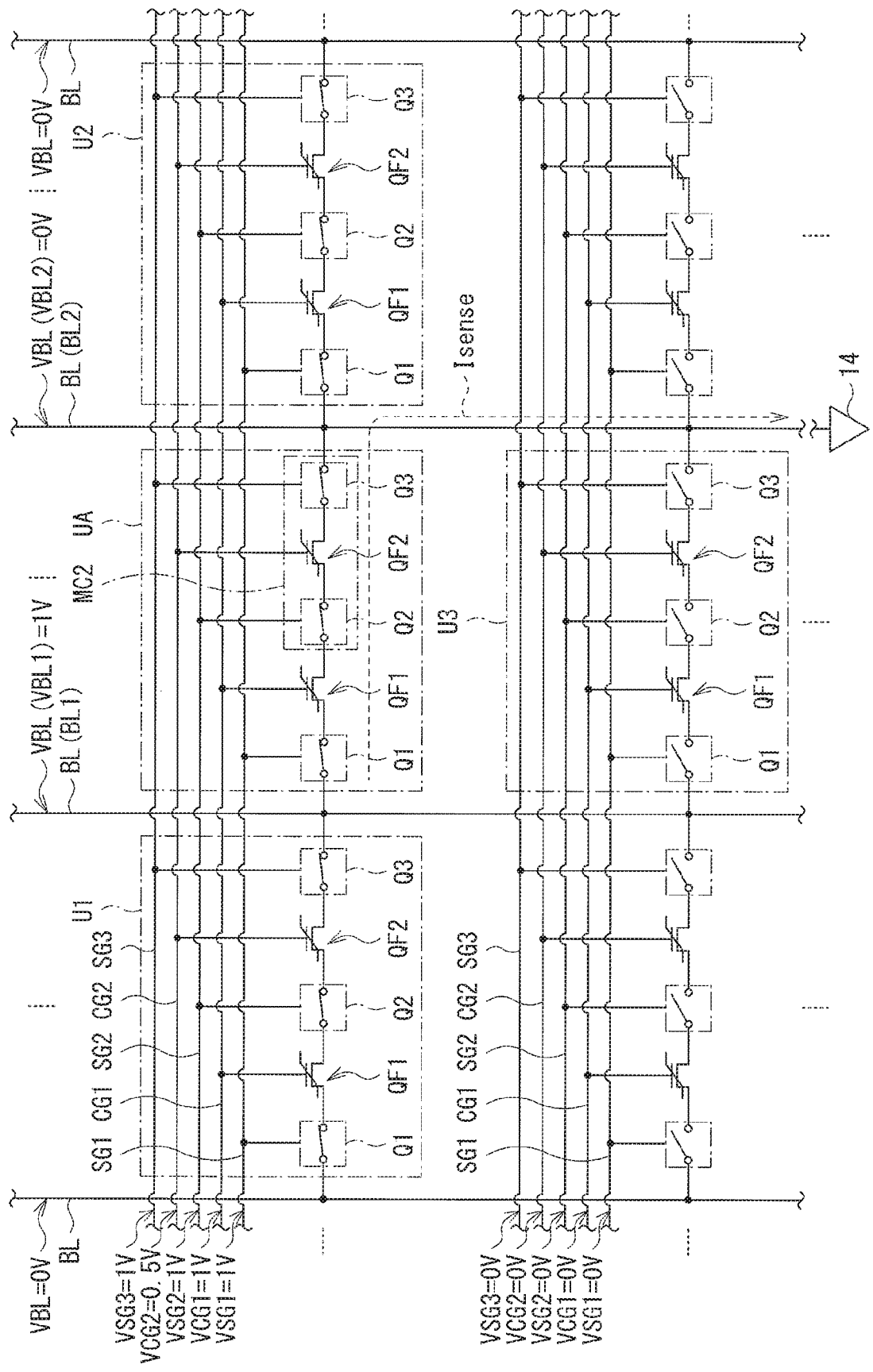
[FIG. 12]

STORAGE DEVICE

CROSS REFERENCE TO RELATED APPLICATIONS

This application is a U.S. National Phase of International Patent Application No. PCT/JP2018/003568 filed on Feb. 2, 2018, which claims priority benefit of Japanese Patent Application No. JP 2017-032548 filed in the Japan Patent Office on Feb. 23, 2017. Each of the above-referenced applications is hereby incorporated herein by reference in its entirety.

TECHNICAL FIELD

The disclosure relates to a storage device that stores information.

BACKGROUND ART

For a nonvolatile semiconductor memory, a ferroelectric gate transistor that makes it possible to store information using characteristics of spontaneous polarization of a ferroelectric substance is often used. For example, PTL1 discloses a storage device including a memory cell that includes two MOS (Metal Oxide Semiconductor) transistors and a ferroelectric gate transistor.

CITATION LIST

Patent Literature

PTL1: Japanese Unexamined Patent Application Publication No. H02-64993

SUMMARY OF THE INVENTION

Meanwhile, it is desired that a memory cell in a storage device has a smaller size, and further reduction in cell size is expected.

It is desirable to provide a storage device that makes it possible to reduce a cell size.

A storage device according to an embodiment of the disclosure includes a first transistor and a second transistor, a first signal line and a second signal line, a first switch transistor, a second switch transistor, and a third switch transistor. The first transistor and the second transistor each include a first diffusion layer, a second diffusion layer, and a gate, and are each able to store a threshold state. The first switch transistor is turned on and couples the first signal line and the first diffusion layer of the first transistor. The second switch transistor is turned on and couples the second diffusion layer of the first transistor and the first diffusion layer of the second transistor. The third switch transistor is turned on and couples the second diffusion layer of the second transistor and the second signal line.

The storage device according to the embodiment of the disclosure includes the first and the second transistors and the first to the third switch transistors. Turning on the first switch transistor couples the first signal line and the first diffusion layer of the first transistor. Turning on the second switch transistor couples the second diffusion layer of the first transistor and the first diffusion layer of the second transistor. Turning on the third switch transistor couples the second diffusion layer of the second transistor and the second signal line.

The storage device according to the embodiment of the disclosure includes the first and the second transistors and the first to the third transistors, thus making it possible to reduce the cell size. It is to be noted that the effects described here are not necessarily limitative, and may be any of the effects described in the disclosure.

BRIEF DESCRIPTION OF DRAWINGS

FIG. 1 is a block diagram that illustrates an example of a configuration of a storage device according to an embodiment of the disclosure.

FIG. 2 is a circuit diagram that illustrates an example of a configuration of a memory cell array illustrated in FIG. 1.

FIG. 3 is another circuit diagram that illustrates an example of the configuration of the memory cell array illustrated in FIG. 1.

FIG. 4 is a layout diagram that illustrates an example of the configuration of the memory cell array illustrated in FIG. 1.

FIG. 5 is a table that illustrates an example of an operation of the storage device illustrated in FIG. 1.

FIG. 6 describes an example of a programming operation of the storage device illustrated in FIG. 1.

FIG. 7 describes an example of an erasing operation of the storage device illustrated in FIG. 1.

FIG. 8 describes an example of a reading operation of the storage device illustrated in FIG. 1.

FIG. 9 is a table that illustrates another example of an operation of the storage device illustrated in FIG. 1.

FIG. 10 describes another example of the programming operation of the storage device illustrated in FIG. 1.

FIG. 11 describes another example of the erasing operation of the storage device illustrated in FIG. 1.

FIG. 12 describes another example of the reading operation of the storage device illustrated in FIG. 1.

MODES FOR CARRYING OUT THE INVENTION

In the following, some embodiments of the disclosure are described in detail with reference to the drawings.

Embodiment

Configuration Example

FIG. 1 illustrates an example of a configuration of a storage device (storage device 1) according to an embodiment. The storage device 1 is a nonvolatile storage device using a ferroelectric gate transistor as a storage element. The storage device 1 includes a controller 11, a memory cell array 20, drivers 12 and 13, and a memory cell array 20.

The controller 11 controls an operation of the storage device 1. Specifically, the controller 11 controls the operation of the drivers 12 and 13 on the basis of a write command and write data that are supplied from outside, to cause information to be written to a memory cell MC (described later) in the memory cell array 20. In addition, the controller 11, on the basis of a read command supplied from outside, controls the operation of the drivers 12 and 13 to cause information to be read from the memory cell MC.

The memory cell array 20 includes memory cells MC provided in a matrix.

FIGS. 2 and 3 each illustrate an example of a configuration of the memory cell array 20. The memory cell array 20 includes a plurality of selection gate lines SG1, a plurality of selection gate lines SG2, a plurality of selection gate lines SG3, a plurality of gate lines CG1, a plurality of gate lines CG2, and a plurality of bit lines BL. The selection gate lines SG1 extend horizontally in FIGS. 2 and 3, and each selection gate line SG1 has one end coupled to the driver 12. The selection gate lines SG2 extend horizontally in FIGS. 2 and 3, and each selection gate line SG2 has one end coupled to the driver 12. The selection gate lines SG3 extend horizontally in FIGS. 2 and 3, and each selection gate line SG3 has one end coupled to the driver 12. The gate lines CG1 extend horizontally in FIGS. 2 and 3, and each gate line CG1 has one end coupled to the driver 12. The gate lines CG2 extend horizontally in FIGS. 2 and 3, and each gate line CG2 has one end coupled to the driver 12. The bit lines BL extend vertically in FIGS. 2 and 3, and each bit line BL has one end coupled to the driver 13.

As illustrated in FIG. 3, in the memory cell array 20, a plurality of memory cells MC is provided on a memory unit U basis. The memory units U each include two memory cells MC1 and MC2. As illustrated in FIG. 2, the memory unit U includes three transistors Q (transistors Q1, Q2, and Q3) and two ferroelectric gate transistors QF (ferroelectric gate transistors QF1 and QF2). The transistor Q1, the ferroelectric gate transistor QF1, and the transistor Q2 configure the memory cell MC1, and the transistor Q2, the ferroelectric gate transistor QF2, and the transistor Q3 configure the memory cell MC2.

It is to be noted that in the following description, for convenience of description, the transistor Q and the ferroelectric gate transistor QF are defined as a drain (diffusion layer) and a source (diffusion layer), respectively. However, this definition is not limitative, and the drain and the source may be interchangeably used.

The transistor Q is an N-type MOS transistor. In this example, a threshold Vth of the transistor Q is set to "0.5 V".

The ferroelectric gate transistor QF is what is called a ferroelectric-gate field-effect transistor (FeFET; Ferroelectric-gate Field-Effect Transistor), and functions as a non-volatile memory. In this ferroelectric gate transistor QF, what is called a gate oxide film in the N-type MOS transistor is replaced by a gate insulation film that includes a ferroelectric material. A threshold state of the ferroelectric gate transistor QF changes as a result of the ferroelectric substance in the gate insulation film being polarized in accordance with a polarity of a voltage difference Vgb (=Vg−Vb) between a voltage Vg at the gate and a voltage Vb at the diffusion layer (source or drain). In this example, the ferroelectric gate transistor QF can take two identifiable threshold states (a low threshold state VthL and a high threshold state VthH). The threshold Vth in the low threshold state VthL is "−0.7 V", for example, and the threshold Vth in the high threshold state VthH is "0.7 V", for example. It is to be noted that in an unpolarized state, the threshold Vth of the ferroelectric gate transistor QF is set to "0 V", for example.

The low threshold state VthL corresponds to data "1" in this example, and the high threshold state VthH corresponds to data "0" in this example. In other words, the ferroelectric gate transistor QF functions as a storage element that stores 1-bit data. Hereinafter, causing a change from the high threshold state VthH (data "0") to the low threshold state VthL (data "1") is referred to as "programming", and causing a change from the low threshold state VthL (data "1") to the high threshold state VthH (data "0") is referred to as "erasing".

For example, in the programming operation, as described later, the voltage Vb at the diffusion layer (source or drain) of the ferroelectric gate transistor QF is set lower than the voltage Vg at the gate of the ferroelectric gate transistor QF. In other words, the voltage difference Vgb (=Vg−Vb) is set to a predetermined positive voltage difference. For example, this predetermined positive voltage difference is a voltage of "+2 V" or higher. In the gate insulation film, this causes the ferroelectric substance to be polarized in accordance with a direction of electric field, and the polarized state is maintained. As a result, the threshold Vth of the ferroelectric gate transistor QF is set to a low voltage ("−0.7 V") (low threshold state VthL).

In addition, for example, in the erasing operation, as described later, the voltage Vb at the diffusion layer (source or drain) of the ferroelectric gate transistor QF is set higher than the voltage Vg at the gate of the ferroelectric gate transistor QF. In other words, the voltage difference Vgb (=Vg−Vb) is set to a predetermined negative voltage difference. For example, this predetermined negative voltage difference is a voltage of "−2 V" or lower. In the gate insulation film, this causes the ferroelectric substance to be polarized in accordance with a direction of electric field, and the polarized state is maintained. A direction of this polarization vector is opposite to a direction of the polarization vector in a case of setting the voltage difference Vgb to the predetermined negative voltage difference. As a result, the threshold Vth of the ferroelectric gate transistor QF is set to a high voltage ("0.7 V") (high threshold state VthH).

In the reading operation, as described later, for example, the storage device 1 sets the voltage at the source and the drain of the ferroelectric gate transistor QF to about "0 V", and applies a predetermined voltage (for example, "0.5 V") to the gate. In a case where the threshold state of the ferroelectric gate transistor QF is the low threshold state VthL (data "1"), the ferroelectric gate transistor QF turns on, and in a case where the threshold state of the ferroelectric gate transistor QF is the high threshold state VthH (data "0"), the ferroelectric gate transistor QF turns off. Under such a bias condition, the storage device 1 reads information stored in the ferroelectric gate transistor QF by detecting which one of the states, an on-state or an off-state, the ferroelectric gate transistor QF is in.

In each memory unit U (FIG. 2), the transistor Q1 has a gate coupled to the selection gate line SG1, a source coupled to the bit line BL (for example, an n-th bit line BL(n)), and a drain coupled to the source of the ferroelectric gate transistor QF1. The ferroelectric gate transistor QF1 has a gate coupled to the gate line CG1, a source coupled to the drain of the transistor Q1, and a drain coupled to the source of the transistor Q2. The transistor Q2 has a gate coupled to the selection gate line SG2, a source coupled to the drain of the ferroelectric gate transistor QF1, and a drain coupled to the drain of the ferroelectric gate transistor QF2. The ferroelectric gate transistor QF2 has a gate coupled to the gate line CG2, a drain coupled to the drain of the transistor Q2, and a source coupled to the drain of the transistor Q3. The transistor Q3 has a gate coupled to the selection gate line SG3, a drain coupled to the source of the ferroelectric gate transistor QF2, and a source coupled to another bit line BL (for example, an (n+1)th bit line BL(n+1)).

Thus, in the storage device 1, five transistors (the transistors Q1 to Q3 and the ferroelectric gate transistors QF1 and QF2) configure two memory cells MC1 and MC2. In other words, one memory cell MC uses 2.5 transistors. In the storage device 1, for example, this makes it possible to reduce the number of transistors as compared to the memory cell described in PTL1, thus making it possible to reduce a cell size of a memory cell.

FIG. 4 illustrates an example of a layout in the memory cell array 20. In this example, a layout of two memory units U arranged horizontally in FIG. 3 is illustrated.

The memory cell array 20 includes a diffusion layer 100, the selection gate lines SG1 to SG3, the gate lines CG1 and CG2, a contact/via 101, and the bit line BL.

The diffusion layer 100 is what is called a semiconductor active layer, and six diffusion layers 100 related to the five transistors (the transistors Q1 to Q3 and the ferroelectric gate transistors QF1 and QF2) included in one memory cell MC are provided to be arranged vertically in FIG. 4. The diffusion layer 100 at the bottom in FIG. 4 corresponds to the source of the transistor Q1. The diffusion layer 100 that is a second from the bottom corresponds to the drain of the transistor Q1 and the source of the ferroelectric gate transistor QF1. The diffusion layer 100 that is a third from the bottom corresponds to the drain of the ferroelectric gate transistor QF1 and the source of the transistor Q2. The diffusion layer 100 that is a fourth from the bottom corresponds to the drain of the transistor Q2 and the drain of the ferroelectric gate transistor QF2. The diffusion layer 100 that is a fifth from the bottom corresponds to the source of the ferroelectric gate transistor QF2 and the drain of the transistor Q3. The diffusion layer 100 at the top corresponds to the source of the transistor Q3.

In this example, the selection gate lines SG1 to SG3 and the gate lines CG1 and CG2 are provided to extend horizontally in FIG. 4. For example, in a layer below the selection gate lines SG1 to SG3, a gate electrode and a gate oxide film (not illustrated) are provided. It is to be noted that this is not limitative, and for example, the selection gate lines SG1 to SG3 may be used as the gate electrode. The selection gate line SG1 and the diffusion layer 100 in the neighborhood of that selection gate line SG1 the transistor Q1. The selection gate line SG2 and the diffusion layer 100 in the neighborhood of that selection gate line SG2 configure the transistor Q2. The selection gate line SG3 and the diffusion layer 100 in the neighborhood of that selection gate line SG3 configure the transistor Q3. In a layer below the gate lines CG1 and CG2, a gate insulation film (not illustrated) including the gate electrode and the ferroelectric material is provided. It is to be noted that this is not limitative, and for example, the gate lines CG1 and CG2 may be used as the gate electrode. The gate line CG1 and the diffusion layer 100 in the neighborhood of the gate line CG1 configure the ferroelectric gate transistor QF1, and the gate line CG2 and the diffusion layer 100 in the neighborhood of that gate line CG2 configure the ferroelectric gate transistor QF2.

The contact/via 101 couples the source (diffusion layer 100) of the transistor Q1 and the bit line BL (for example, the n-th bit line BL(n)). A contact/via 102 couples the source (diffusion layer 100) of the transistor Q3 and another bit line BL (for example, the (n+1)th bit line BL(n+1)). In this example, the bit lines BL are provided to extend obliquely in FIG. 4.

In this example, the diffusion layers 100 are provided to be arranged vertically in FIG. 4, and the bit lines BL are provided to extend obliquely in FIG. 4, but this is not limitative. Alternatively, for example, the bit lines BL may be provided in a stepwise fashion. In addition, for example, the bit lines BL may be provided to extend vertically in FIG. 4, and the diffusion layers 100 may be provided to be arranged obliquely in FIG. 4.

In the writing operation and the reading operation, on the basis of a control signal supplied from the controller 11, the driver 12 applies a voltage VSG1 to the selection gate line SG1, applies a voltage VSG2 to the selection gate line SG2, applies a voltage VSG3 to the selection gate line SG3, applies a voltage VCG1 to the gate line CG1, and applies a voltage VCG2 to the gate line CG2.

In the writing operation and the reading operation, the driver 13 applies a voltage VBL to the bit line BL on the basis of a control signal supplied from the controller 11. The driver 13 includes a sense amplifier 14. In the reading operation, the sense amplifier 14 reads information stored in the memory cell MC, on the basis of a current flowing in the bit line BL. Then, the driver 13 supplies the read information to the controller 11.

Here, the ferroelectric gate transistor QF1 corresponds to a specific example of a "first transistor" in the disclosure. The ferroelectric gate transistor QF2 corresponds to a specific example of a "second transistor" in the disclosure. The transistor Q1 corresponds to a specific example of a "first switch transistor" in the disclosure. The transistor Q2 corresponds to a specific example of a "second switch transistor" in the disclosure. The transistor Q3 corresponds to a specific example of a "third switch transistor" in the disclosure. The drivers 12 and 13 each correspond to a specific example of a "driver" in the disclosure.

[Operations and Workings]

The operations and workings of the storage device 1 according to the present embodiment are subsequently described.

(Overview of Overall Operation)

First, with reference to FIG. 1, an outline of an overall operation of the storage device 1 is described. The controller 11 controls the operation of the memory cell array 20. Specifically, on the basis of the write command and the write data supplied from outside, the controller 11 controls the operation of the drivers 12 and 13 to cause information to be written to the memory cell MC in the memory cell array 20. In addition, on the basis of the read command supplied from outside, the controller 11 controls the operation of the drivers 12 and 13 to cause information to be read from the memory cell MC. In the writing operation and the reading operation, on the basis of the control signal supplied from the controller 11, the driver 12 applies the voltage VSG1 to the selection gate line SG1, applies the voltage VSG2 to the selection gate line SG2, applies the voltage VSG3 to the selection gate line SG3, applies the voltage VCG1 to the gate line CG1, and applies the voltage VCG2 to the gate line CG2. In the writing operation and the reading operation, the driver 13 applies the voltage VBL to the bit line BL on the basis of the control signal supplied from the controller 11. In addition, in the reading operation, the sense amplifier 14 in the driver 13 reads the information stored in the memory cell MC, on the basis of the current flowing in the bit line BL. Then, the driver 13 supplies the read information to the controller 11.

(Detailed Operation)

Next, the writing operation (the programming operation and the erasing operation), and the reading operation are described in detail. First, an operation performed on the memory cell MC1 that is selected as a processing target is described, and then an operation performed on the memory cell MC2 that is selected as a processing target is described.

(Writing Operation and Reading Operation Performed on the Memory Cell MC1)

FIG. 5 illustrates an example of voltages VSG1, VCG1, VSG2, VCG2, VSG3, VBL1, and VBL2 each applied to the memory unit UA including the selected memory cell MC1 in the case of performing the writing operation and the reading operation on the selected memory cell MC1. These voltages VSG1 to VSG3 in FIG. 5 each indicate a voltage at a corresponding one of the selection gate lines SG1 to SG3 coupled to the memory unit UA, the voltages VCG1 and VCG2 in FIG. 5 each indicate a voltage at a corresponding one of the gate lines CG1 and CG2 coupled to the memory unit UA, the voltage VBL1 indicates a voltage at a bit line BL (BL1) coupled to the memory cell MC1 in the memory unit UA, and the voltage VBL2 indicates a voltage at a bit line BL (BL2) coupled to the memory cell MC2 in the memory unit UA.

FIG. 6 illustrates an example of the programming operation performed on the memory cell MC1. FIG. 7 illustrates an example of the erasing operation performed on the memory cell MC1. FIG. 8 illustrates an example of the reading operation performed on the memory cell MC1. In FIGS. 6 to 8, each of the transistors Q1 to Q3 is illustrated using a switch that indicates the operation state thereof.

(Programming Operation Performed on the Memory Cell MC1)

In the case of performing the programming operation, as illustrated in FIG. 5, the driver 12 sets the voltages VSG1, VCG1, VSG2, VCG2, and VSG3 to "3 V", "3 V", "0 V", "0 V", and "0 V", respectively. In addition, the driver 13 sets the voltages VBL1 and VBL2 to "0 V" and "3 V", respectively. In addition, as illustrated in FIG. 6, the drivers 12 and 13 set, to "0 V", all of the voltages VSG1 to VSG3 at selection gate lines SG1 to SG3 other than the selection gate lines SG1 to SG3 coupled to the memory unit UA and the voltages VCG1 and VCG2 at gate lines CG1 and CG2 other than the gate lines CG1 and CG2 coupled to the memory unit UA, while setting, to "3 V", all the voltages VBL at bit lines BL other than the bit line BL coupled to the memory unit UA.

As illustrated in FIG. 6, in the memory cell MC1 that is the target of the programming operation, the voltage VSG1 ("3 V") is applied to the gate of the transistor Q1, thus turning on the transistor Q1. In addition, the voltage VBL1 at the bit line BL1 coupled to the memory cell MC1 is "0 V". This causes the voltage VBL1 ("0 V") to be applied to the source of the ferroelectric gate transistor QF1. To the gate of that ferroelectric gate transistor QF1, the voltage VCG1 ("3 V") is applied, thus causing the voltage difference Vgb (=Vg−Vb) between the voltage Vg at the gate of, and the voltage Vb at the diffusion layer (source or drain) of the ferroelectric gate transistor QF1 to be "3 V". The voltage difference Vgb is a voltage sufficient to change the threshold state of the ferroelectric gate transistor QF1 to the low threshold state VthL, thus causing the threshold Vth of the ferroelectric gate transistor QF1 to be low (low threshold state VthL). Thus, the storage device 1 performs the programming operation on the memory cell MC1.

In the programming operation, the data stored in the memory cell MC2 in the memory unit UA are maintained. In other words, the voltage VSG2 is "0 V", thus turning off the transistor Q2, and the voltage VSG3 is "0 V", thus turning off the transistor Q3. Accordingly, a voltage is applied neither to the source nor to the drain of the ferroelectric gate transistor QF2, and thus the threshold state of the ferroelectric gate transistor QF2 is maintained.

In addition, in the programming operation, the data stored in the memory cells MC1 and MC2 in another memory unit U that belongs to the same row as the memory unit UA are also maintained. Specifically, for example, the voltage VSG1 ("3 V") is applied to the gate of the transistor Q1 in a memory unit U1 that is on the left side of the memory unit UA, and the voltage VBL at the bit line BL coupled to the transistor Q1 is "3 V", thus causing the voltage at the source of the ferroelectric gate transistor QF1 in the memory unit U1 to be the "2.5 V". In other words, to the source of the ferroelectric gate transistor QF1, a voltage ("2.5 V") that is lower than the voltage VSG1 ("3 V") by the threshold Vth ("0.5 V") of the transistor Q1 is applied. To the gate of the ferroelectric gate transistor QF1, the voltage VCG1 ("3 V") is applied, thus causing the voltage difference Vgb (=Vg−Vb) between the voltage Vg at the gate of, and the voltage Vb at the diffusion layer (source or drain) of the ferroelectric gate transistor QF1 to be "0.5 V". The voltage difference Vgb is not a voltage sufficient to change the threshold state of the ferroelectric gate transistor QF1 to the low threshold state VthL, and thus the threshold state of the ferroelectric gate transistor QF1 is maintained. In addition, the transistors Q2 and Q3 are in an off-state, and thus the threshold state of the ferroelectric gate transistor QF2 is maintained. The memory unit U1 on the left side of the memory unit UA has been described above, but the same applies to a memory unit U2 that is on the right side of the memory unit UA.

In addition, in the programming operation, the data stored in the memory cells MC1 an MC2 in another memory unit U that belongs to a different row from the memory unit UA are also maintained. Specifically, for example, all of the voltages VSG1 to VSG3, VCG1, and VCG2 in a memory unit U3 below the memory unit UA are "0 V", thus turning off the transistors Q1 to Q3. Accordingly, the threshold states of the ferroelectric gate transistors QF1 and QF2 are maintained.

(Erasing Operation Performed on the Memory Cell MC1)

In the case of performing the erasing operation, as illustrated in FIG. 5, the driver 12 sets the voltages VSG1, VCG1, VSG2, VCG2, and VSG3 to "3 V", "0 V", "0 V", "0 V", and "0 V", respectively. In addition, the driver 13 sets the voltages VBL1 and VBL2 to "3 V" and "0 V", respectively. In addition, as illustrated in FIG. 7, the drivers 12 and 13 set, to "0 V", all of the voltages VSG1 to VSG3 at selection gate lines SG1 to SG3 other than the selection gate lines SG1 to SG3 coupled to the memory unit UA, the voltages VCG1 and VCG2 at gate lines CG1 and CG2 other than the gate lines CG1 and CG2 coupled to the memory unit UA, and the voltages VBL at bit lines BL other than the bit line BL coupled to the memory unit UA.

As illustrated in FIG. 7, in the memory cell MC1 that is the target of the erasing operation, the voltage VSG1 ("3 V") is applied to the gate of the transistor Q1, thus turning on the transistor Q1. In addition, the voltage VBL1 at the bit line BL1 coupled to the memory cell MC1 is "3 V". This causes the voltage at the source of the ferroelectric gate transistor QF1 to be "2.5 V". To the gate of the ferroelectric gate transistor QF1, the voltage VCG1 ("0 V") is applied, thus causing the voltage difference Vgb (=Vg−Vb) between the voltage Vg at the gate of the ferroelectric gate transistor QF1 and the voltage Vb at the diffusion layer (source or drain) of the ferroelectric gate transistor QF1 to be "−2.5 V". The voltage difference Vgb is a voltage sufficient to change the threshold state of the ferroelectric gate transistor QF1 to the high threshold state VthH, thus causing the threshold Vth of the ferroelectric gate transistor QF1 to be high (high threshold state VthH). Thus, the storage device 1 performs the erasing operation on the memory cell MC1.

In the erasing operation, the data stored in the memory cell MC2 in the memory unit UA are maintained. In other words, the voltage VSG2 is "0 V", thus turning off the transistor Q2, and the voltage VSG3 is "0 V", thus turning off the transistor Q3. Accordingly, a voltage is applied neither to the source nor to the drain of the ferroelectric gate transistor QF2, and thus the threshold state of the ferroelectric gate transistor QF2 is maintained.

In addition, in the erasing operation, the data stored in the memory cells MC1 and MC2 in another memory unit U that belongs to the same row as the memory unit UA are also maintained. Specifically, for example, the voltages VSG1 to VSG3, VCG1, and VCG2 in the memory unit U1 on the left side of the memory unit UA are the same as the voltages VSG1 to VSG3, VCG1, and VCG2 in the memory unit UA. Accordingly, the voltage VSG1 ("3 V") is applied to the gate of the transistor Q1 in the memory unit U1, thus turning on the transistor Q1. However, the voltage VBL at the bit line BL coupled to the transistor Q1 is "0 V", thus causing the voltage at the source of the ferroelectric gate transistor QF1 in the memory unit U1 to be "0 V". Accordingly, in the ferroelectric gate transistor QF1, the voltage difference Vgb (=Vg−Vb) between the voltage Vg at the gate and the voltage Vb at the diffusion layer (source or drain) becomes "0 V", and thus the threshold state of the ferroelectric gate transistor QF1 is maintained. In addition, the transistors Q2 and Q3 are in an off-state, and thus the threshold state of the ferroelectric gate transistor QF2 is maintained. The memory unit U1 on the left side of the memory unit UA has been described above, but the same applies to the memory unit U2 on the right side of the memory unit UA.

In addition, in the erasing operation, the data stored in the memory cells MC1 and MC2 in another memory unit U that belongs to a different row from the memory unit UA are also maintained. Specifically, for example, all of the voltages VSG1 to VSG3, VCG1, and VCG2 in the memory unit U3 below the memory unit UA are "0 V", thus turning off the transistors Q1 to Q3. Accordingly, the threshold states of the ferroelectric gate transistors QF1 and QF2 are maintained.

(Reading Operation Performed on the Memory Cell MC1)

In the case of performing the reading operation, as illustrated in FIG. 5, the driver 12 sets the voltages VSG1, VCG1, VSG2, VCG2, and VSG3 to "1 V", "0.5 V", "1 V", "1 V", and "1 V", respectively. In addition, the driver 13 sets the voltages VBL1 and VBL2 to "0 V" and "1 V", respectively. In addition, as illustrated in FIG. 8, the drivers 12 and 13 set, to "0 V", all of the voltages VSG1 to VSG3 at selection gate lines SG1 to SG3 other than the selection gate lines SG1 to SG3 coupled to the memory unit UA, the voltages VCG1 and VCG2 at gate lines CG1 and CG2 other than the gate lines CG1 and CG2 coupled to the memory unit UA, and the voltages VBL at bit lines BL other than the bit line BL coupled to the memory unit UA.

As illustrated in FIG. 8, in the memory cell MC1 that is the target of the reading operation, the voltage VSG1 ("1 V") is applied to the gate of the transistor Q1, thus turning on the transistor Q1, the voltage VSG2 ("1 V") is applied to the gate of the transistor Q2, thus turning on the transistor Q2, and the voltage VSG3 ("1 V") is applied to the gate of the transistor Q3, thus turning on the transistor Q3. In addition, to the gate of the ferroelectric gate transistor QF2, the voltage VCG2 ("1 V") is applied, thus turning on the ferroelectric gate transistor QF2 irrespective of the threshold state. In other words, in a case where the threshold state is the low threshold state VthL, the threshold Vth is "−0.7 V", thus turning on the ferroelectric gate transistor QF2, and in a case where the threshold state is the high threshold state VthH, the threshold Vth is "0.7 V", thus turning on the ferroelectric gate transistor QF2.

Meanwhile, to the gate of the ferroelectric gate transistor QF1, the voltage VCG1 ("0.5 V") is applied, thus turning on or off the ferroelectric gate transistor QF1 in accordance with the threshold state. In other words, in a case where the threshold state is the low threshold state VthL, the threshold Vth is "−0.7 V", thus turning on the ferroelectric gate transistor QF1, and in a case where the threshold state is the high threshold state VthH, the threshold Vth is "0.7 V", thus turning off the ferroelectric gate transistor QF1. To the bit line BL2 coupled to the memory cell MC2, the voltage VBL2 ("1 V") is applied, and the voltage VBL1 ("0 V") is applied to the bit line BL1 coupled to the memory cell MC1, thus causing a current Isense to flow from the bit line BL2 to the bit line BL1 via the memory unit UA in accordance with the threshold state of the ferroelectric gate transistor QF1. The sense amplifier 14 in the driver 13 reads the data stored in the memory cell MC1 in the memory unit UA by comparing the current Isense flowing in the bit line BL1 with a predetermined current threshold Ith.

For example, in a case where the data "1" is stored in the memory cell MC1, the threshold state of the ferroelectric gate transistor QF1 in the memory cell MC1 is the low threshold state VthL, thus turning on the ferroelectric gate transistor QF1. Accordingly, a current value of the current Isense is higher than the predetermined current threshold Ith, thus causing the sense amplifier 14 to output "1". In addition, for example, in a case where the data "0" is stored in the memory cell MC1, the threshold state of the ferroelectric gate transistor QF1 in the memory cell MC1 is the high threshold state VthH, thus turning off the ferroelectric gate transistor QF1. Accordingly, the current value of the current Isense is lower than the predetermined current threshold Ith, thus causing the sense amplifier 14 to output "0". Thus, the storage device 1 performs the reading operation on the memory cell MC1.

In the reading operation, the data stored in all the memory cells MC1 and MC2 in the memory cell array 20 are maintained. In other words, all of the voltages VCG1 and VCG2 at the gate lines CG1 and CG2 and the voltages VBL at the bit lines BL are equal to or greater than "0 V" and equal to or less than "1 V". Accordingly, in all the ferroelectric gate transistors QF, the voltage difference Vgb (=Vg−Vb) between the voltage Vg at the gate and the voltage Vb at the diffusion layer (source or drain) is not a voltage sufficient to change the threshold state. As a result, the threshold states of all the ferroelectric gate transistors QF in the memory cell array 20 are maintained.

In addition, in the reading operation, a plurality of memory units U coupled to the bit line BL1 coupled to the memory cell MC1 in the memory unit UA does not influence the current Isense. In other words, for example, in the memory unit U1 on the left side of the memory unit UA, both of the voltages at two bit lines BL coupled to that memory unit U1 are "0 V", and thus the memory unit U1 does not influence the current Isense. In addition, for example, all of the voltages VSG1 to VSG3, VCG1, and VSG2 in the memory unit U3 below the memory unit UA are "0 V", thus turning off the transistors Q1 to Q3. Accordingly, the memory unit U3 does not influence the current Isense.

(Writing Operation and Reading Operation Performed on the Memory Cell MC2)

FIG. 9 illustrates an example of the voltages VSG1, VCG1, VSG2, VCG2, VSG3, VBL1, and VBL2 each applied to the memory unit UA including the selected memory cell MC2 in the case of performing the writing operation and the reading operation on the selected memory cell MC2. FIG. 10 illustrates an example of the programming operation performed on the memory cell MC2. FIG. 11 illustrates an example of the erasing operation performed on the memory cell MC2. FIG. 12 illustrates an example of the reading operation performed on the memory cell MC2.

(Programming Operation Performed on the Memory Cell MC2)

In the case of performing the programming operation, as illustrated in FIG. 9, the driver 12 sets the voltages VSG1, VCG1, VSG2, VCG2, and VSG3 to "0 V", "0 V", "0 V", "3 V", and "3 V", respectively. In addition, the driver 13 sets the voltages VBL1 and VBL2 to "3 V" and "0 V", respectively. In addition, as illustrated in FIG. 10, the drivers 12 and 13 set, to "0 V", all of the voltages VSG1 to VSG3 at selection gate lines SG1 to SG3 other than the selection gate lines SG1 to SG3 coupled to the memory unit UA and the voltage VCG1 and VCG2 at gate lines CG1 and CG2 other than the gate lines CG1 and CG2 coupled to the memory unit UA, while setting, to "3 V", all the voltages VBL at bit lines BL other than the bit line BL coupled to the memory unit UA.

As illustrated in FIG. 10, in the memory cell MC2 that is the target of the programming operation, the voltage VSG3 ("3 V") is applied to the gate of the transistor Q3, thus turning on the transistor Q3. In addition, the voltage VBL2 at the bit line BL2 coupled to the memory cell MC2 is "0 V". This causes the voltage VBL2 ("0 V") to be applied to the source of the ferroelectric gate transistor QF2. To the gate of the ferroelectric gate transistor QF2, the voltage VCG2 ("3 V") is applied, thus causing the voltage difference Vgb (=Vg−Vb) between the voltage Vg at the gate of, and the voltage Vb at the diffusion layer (source or drain) of the ferroelectric gate transistor QF2 to be "3 V". The voltage difference Vgb is a voltage sufficient to change the threshold state of the ferroelectric gate transistor QF2 to the low threshold state VthL, thus causing the threshold Vth of the ferroelectric gate transistor QF2 to be low (low threshold state VthL). Thus, the storage device 1 performs the programming operation on the memory cell MC2.

(Erasing Operation Performed on the Memory Cell MC2)

In the case of performing the erasing operation, as illustrated in FIG. 9, the driver 12 sets the voltages VSG1, VCG1, VSG2, VCG2, and VSG3 to "0 V", "0 V", "0 V", "0 V", and "3 V", respectively. In addition, the driver 13 sets the voltages VBL1 and VBL2 to "0 V" and "3 V", respectively. In addition, as illustrated in FIG. 11, the drivers 12 and 13 set, to "0 V", all of the voltages VSG1 to VSG3 at selection gate lines SG1 to SG3 other than the selection gate lines SG1 to SG3 coupled to the memory unit UA, the voltages VCG1 and VCG2 at gate lines CG1 and CG2 other than the gate lines CG1 and CG2 coupled to the memory unit UA, and the voltages VBL at bit lines BL other than the bit line BL coupled to the memory unit UA.

As illustrated in FIG. 11, in the memory cell MC2 that is the target of the erasing operation, the voltage VSG3 ("3 V") is applied to the gate of the transistor Q3, thus turning on the transistor Q3. In addition, the voltage VBL2 at the bit line BL2 coupled to the memory cell MC1 is "3 V". This causes the voltage at the source of the ferroelectric gate transistor QF2 to be "2.5 V". To the gate of the ferroelectric gate transistor QF2, the voltage VCG2 ("0 V") is applied, thus causing the voltage difference Vgb (=Vg−Vb) between the voltage Vg at the gate of, and the voltage Vb at the diffusion layer (source or drain) of the ferroelectric gate transistor QF2 to be "−2.5 V". The voltage difference Vgb is a voltage sufficient to change the threshold state of the ferroelectric gate transistor QF2 to the high threshold state VthH, thus causing the threshold Vth of the ferroelectric gate transistor QF2 to be high (high threshold state VthH). Thus, the storage device 1 performs the erasing operation on the memory cell MC2.

(Reading Operation Performed on the Memory Cell MC2)

In the case of performing the reading operation, as illustrated in FIG. 9, the driver 12 sets the voltages VSG1, VCG1, VSG2, VCG2, and VSG3 to "1 V", "1 V", "1 V", "0.5 V", and "1 V", respectively. In addition, the driver 13 sets the voltages VBL1 and VBL2 to "1 V" and "0 V", respectively. In addition, as illustrated in FIG. 12, the drivers 12 and 13 set, to "0 V", all of the voltages VSG1 to VSG3 at selection gate lines SG1 to SG3 other than the selection gate lines SG1 to SG3 coupled to the memory unit UA, the voltages VCG1 and VCG2 at gate lines CG1 and CG2 other than the gate lines CG1 and CG2 coupled to the memory unit UA, and the voltages VBL at bit lines BL other than the bit line BL coupled to the memory unit UA.

As illustrated in FIG. 12, in the memory cell MC2 that is the target of the reading operation, the voltage VSG1 ("1 V") is applied to the gate of the transistor Q1, thus turning on the transistor Q1, the voltage VSG2 ("1 V") is applied to the gate of the transistor Q2, thus turning on the transistor Q2, and the voltage VSG3 ("1 V") is applied to the gate of the transistor Q3, thus turning on the transistor Q3. In addition, to the gate of the ferroelectric gate transistor QF1, the voltage VCG1 ("1 V") is applied, thus turning on the ferroelectric gate transistor QF1 irrespective of the threshold state.

Meanwhile, to the gate of the ferroelectric gate transistor QF2, the voltage VCG2 ("0.5 V") is applied, thus turning on or off the ferroelectric gate transistor QF2 in accordance with the threshold state. To the bit line BL1 coupled to the memory cell MC1, the voltage VBL1 ("1 V") is applied, and the voltage VBL2 ("0 V") is applied to the bit line BL2 coupled to the memory cell MC2, thus causing the current Isense to flow from the bit line BL1 to the bit line BL2 via the memory unit UA in accordance with the threshold state of the ferroelectric gate transistor QF2. The sense amplifier 14 in the driver 13 reads the data stored in the memory cell MC2 in the memory unit UA by comparing the current Isense flowing in the bit line BL2 with the predetermined current threshold Ith.

In the storage device 1, the transistor Q1, the ferroelectric gate transistor QF1, the transistor Q2, the ferroelectric gate transistor QF2, and the transistor Q3 are coupled in this order. In addition, the source of the transistor Q1 is coupled to the bit line BL, and the source of the transistor Q3 is coupled to another bit line BL. In the storage device 1, this allows one memory cell MC to be configured by 2.5 transistors, thus making it possible to reduce the number of transistors and therefore reduce the cell size of the memory cell. Furthermore, in the storage device 1, it is possible, in the programming operation, to perform data programming only on the selected memory cell MC and maintain the information stored in the memory cell MC that is not selected. Likewise, in the storage device 1, it is possible, in the erasing operation, to perform data erasing only on the selected memory cell MC and maintain the information stored in the memory cell MC that is not selected. Thus, in the storage device 1, it is possible to reduce the possibility of occurrence of disturb while allowing performance of random access.

[Effects]

As described above, in the present embodiment, the transistor Q1, the ferroelectric gate transistor QF1, the transistor Q2, the ferroelectric gate transistor QF2, and the transistor Q3 are coupled in this order. This makes it possible to reduce the number of transistors and therefore reduce the cell size of the memory cell. In addition, this also makes it possible to reduce the possibility of occurrence of disturb while allowing performance of random access.

Although the technology has been described above referring to embodiments, the technology is not limited to these embodiments, etc., and may be modified in a variety of ways.

For example, in the foregoing embodiment, each of the transistors Q1 to Q3 and the ferroelectric gate transistor are configured by an N-type transistor, but this is not limitative. Alternatively, a P-type transistor may be used.

In addition, for example, in the foregoing embodiment, the ferroelectric gate transistors QF1 and QF2 are used, but this is not limitative. It is possible to use various transistors able to set the threshold.

It is to be noted that effects described herein are merely illustrative and are not limitative, and may have other effects.

It is to be noted that the technology may have the following configuration.

(1)
A storage device, including:
a first transistor and a second transistor each including a first diffusion layer, a second diffusion layer, and a gate, and that are each able to store a threshold state;
a first signal line and a second signal line;
a first switch transistor that is turned on and couples the first signal line and the first diffusion layer of the first transistor;
a second switch transistor that is turned on and couples the second diffusion layer of the first transistor and the first diffusion layer of the second transistor; and
a third switch transistor that is turned on and couples the second diffusion layer of the second transistor and the second signal line.

(2)
The storage device according to (1), in which the first transistor and the second transistor each further include a gate insulation film that includes a ferroelectric material.

(3)
The storage device according to (1) or (2), further including a driver that, in a first period, sets the threshold state of the first transistor by turning on the first switch transistor, turning off the second switch transistor, applying a first voltage to the gate of the first transistor, and applying a second voltage to the first signal line.

(4)
The storage device according to (3), in which the driver sets the threshold state to a first threshold state by causing the first voltage to be higher than the second voltage, and sets the threshold state to a second threshold state by causing the second voltage to be higher than the first voltage.

(5)
The storage device according to (3) or (4), in which an absolute value of a voltage difference between the first voltage and the second voltage is larger than a predetermined value.

(6)
The storage device according to any one of (3) to (5), in which, in a second period, the driver sets the threshold state of the second transistor by turning on the third switch transistor, turning off the second switch transistor, applying the first voltage to the gate of the second transistor, and applying the second voltage to the second signal line.

(7)
The storage device according to any one of (3) to (6), in which, in a third period, the driver detects the threshold state of the first transistor by turning on the first switch transistor, the second switch transistor, the third switch transistor, and the second transistor, and applying a third voltage to the gate of the first transistor.

(8)
The storage device according to (7), in which, in the third period, the driver applies a fourth voltage to the first signal line, applies a fifth voltage to the second signal line, and detects the threshold state of the first transistor on a basis of a current value of a current flowing in the first signal line.

(9)
The storage device according to (7) or (8), in which, in a fourth period, the driver detects the threshold state of the second transistor by turning on the first switch transistor, the second switch transistor, the third switch transistor, and the first transistor, and applying the third voltage to the gate of the second transistor.

(10)
The storage device according to (1), further including:
a third transistor and a fourth transistor each including a first diffusion layer, a second diffusion layer, and a gate, and that are each able to store a threshold state;
a third signal line;
a fourth switch transistor that includes a gate, and is turned on and couples the third signal line and the first diffusion layer of the third transistor;
a fifth switch transistor that includes a gate, and is turned on and couples the second diffusion layer of the third transistor and the first diffusion layer of the fourth transistor; and
a sixth switch transistor that includes a gate, and is turned on and couples the second diffusion layer of the fourth transistor and the first signal line, in which
the gate of the first transistor is coupled to the gate of the third transistor,
the gate of the second transistor is coupled to the gate of the fourth transistor,
the first switch transistor includes a gate coupled to the gate of the fourth switch transistor,
the second switch transistor includes a gate coupled to the gate of the fifth switch transistor, and
the third switch transistor includes a gate coupled to the gate of the sixth switch transistor.

(11)
The storage device according to (10), further including a driver that, in a first period, sets the threshold state of the first transistor by turning on the first switch transistor and the fourth switch transistor, turning off the second switch transistor and the fifth switch transistor, applying a first voltage to the gate of the first transistor and the gate of the third transistor, and applying a second voltage to the first signal line.

(12)
The storage device according to (11), in which, in the first period, the driver applies, to the second signal line and the third signal line, a voltage corresponding to the first voltage.

(13)
The storage device according to (11) or (12), in which, in a third period, the driver turns on the first switch transistor, the second switch transistor, the third switch transistor, the fourth switch transistor, the fifth switch transistor, the sixth switch transistor, the second transistor, and the fourth transistor, applies a third voltage to the gate of the first transistor and the gate of the third transistor, applies a fourth voltage to the first signal line and the third signal line, applies a fifth voltage to the second signal line, and detects the threshold state of the first transistor on a basis of a current value of a current flowing in the first signal line.

This application claims the benefit of Japanese Priority Patent Application JP2017-032548 filed with the Japan Patent Office on Feb. 23, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A storage device, comprising:
a first transistor and a second transistor that are configured to store a first threshold state,
wherein each of the first transistor and the second transistor includes a first diffusion layer, a second diffusion layer, and a first gate;
a first signal line and a second signal line;
a first switch transistor configured to couple the first signal line and the first diffusion layer of the first transistor based on turn on of the first switch transistor;
a second switch transistor configured to couple the second diffusion layer of the first transistor and the second diffusion layer of the second transistor based on turn on of the second switch transistor; and
a third switch transistor configured to couple the first diffusion layer of the second transistor and the second signal line based on turn on of the third switch transistor.

2. The storage device according to claim 1, wherein
each of the first transistor and the second transistor further includes a gate insulation film, and
the gate insulation film includes a ferroelectric material.

3. The storage device according to claim 1, further comprising a driver configured to:
apply a first voltage to the first gate of the first transistor;
apply a second voltage to the first signal line; and
set, in a first period, the first threshold state of the first transistor based on the turn on of the first switch transistor, turn off of the second switch transistor, the applied first voltage to the first gate of the first transistor, and the applied second voltage to the first signal line.

4. The storage device according to claim 3, wherein the driver is further configured to:
set the first threshold state to a second threshold state based on the first voltage that is higher than the second voltage; and
set the first threshold state to a third threshold state by causing based on the second voltage that is higher than the first voltage.

5. The storage device according to claim 3, wherein an absolute value of a voltage difference between the first voltage and the second voltage is larger than a specific value.

6. The storage device according to claim 3, wherein the driver is further configured to:
apply the first voltage to the first gate of the second transistor;
apply the second voltage to the second signal line; and
set, in a second period, the first threshold state of the second transistor based on the turn on of the third switch transistor, the turn off of the second switch transistor, the applied first voltage to the first gate of the second transistor, and the applied second voltage to the second signal line.

7. The storage device according to claim 3, wherein the driver is further configured to:
apply a third voltage to the first gate of the first transistor; and
detect, in a third period, the first threshold state of the first transistor based on the turn on of the first switch transistor, the turn on of the second switch transistor, the turn on of the third switch transistor, turn on of the second transistor, and the applied third voltage to the first gate of the first transistor.

8. The storage device according to claim 7, wherein the driver is further configured to:
apply, in the third period, a fourth voltage to the first signal line and a fifth voltage to the second signal line; and
detect the first threshold state of the first transistor based on a current value of a current flowing in the first signal line.

9. The storage device according to claim 7, wherein the driver is further configured to:
apply the third voltage to the first gate of the second transistor; and
detect, in a fourth period, the first threshold state of the second transistor based on the turn on of the first switch transistor, the turn on of the second switch transistor, the turn on of the third switch transistor, turn on of the first transistor, and the applied third voltage to the first gate of the second transistor.

10. The storage device according to claim 1, further comprising:
a third transistor and a fourth transistor that are configured to store the first threshold state,
wherein each of the third transistor and the fourth transistor includes third diffusion layer, a fourth diffusion layer, and a second gate;
a third signal line;
a fourth switch transistor that includes a third gate,
wherein the fourth switch transistor is configured to couple the third signal line and the third diffusion layer of the third transistor based on turn on of the fourth switch transistor;
a fifth switch transistor that includes a fourth gate,
wherein the fifth switch transistor is configured to couple the fourth diffusion layer of the third transistor and the fourth diffusion layer of the fourth transistor based on turn on of the fifth switch transistor; and
a sixth switch transistor that includes a fifth gate, wherein
the sixth switch transistor is configured to couple the third diffusion layer of the fourth transistor and the first signal line,
the first gate of the first transistor is coupled to the second gate of the third transistor,
the first gate of the second transistor is coupled to the second gate of the fourth transistor,
the first switch transistor includes a sixth gate coupled to the third gate of the fourth switch transistor,
the second switch transistor includes a seventh gate coupled to the fourth gate of the fifth switch transistor, and
the third switch transistor includes an eighth gate coupled to the fifth gate of the sixth switch transistor.

11. The storage device according to claim 10, further comprising a driver configured to:
apply a first voltage to the first gate of the first transistor and the second gate of the third transistor;
apply a second voltage to the first signal line; and
set, in a first period, the first threshold state of the first transistor based on the turn on of the first switch transistor, the turn on of the fourth switch transistor, turn off of the second switch transistor, turn off of the fifth switch transistor, the applied first voltage to the first gate of the first transistor and the second gate of the third transistor, and the applied second voltage to the first signal line.

12. The storage device according to claim 11, wherein the driver is further configured to apply, in the first period, to the second signal line and the third signal line, a specific voltage corresponding to the first voltage.

13. The storage device according to claim 11, wherein the driver is further configured to:
   turn on, in a third period, each of the first switch transistor, the second switch transistor, the third switch transistor, the fourth switch transistor, the fifth switch transistor, the sixth switch transistor, the second transistor, and the fourth transistor;
   apply a third voltage to the first gate of the first transistor and the second gate of the third transistor;
   apply a fourth voltage to the first signal line and the third signal line;
   apply a fifth voltage to the second signal line; and
   detect the first threshold state of the first transistor based on a current value of a current flowing in the first signal line.

* * * * *